US008106684B2

(12) United States Patent
Takeuchi et al.

(10) Patent No.: US 8,106,684 B2
(45) Date of Patent: Jan. 31, 2012

(54) HIGH-SPEED LOW-VOLTAGE DIFFERENTIAL SIGNALING SYSTEM

(75) Inventors: Hiroshi Takeuchi, Los Altos, CA (US); Hideki Yokoshima, Kanagawa (JP); Yuya Kondo, Kanagawa (JP)

(73) Assignee: Sony Corporation, Manato-Ku, Tokyo (JP)

( * ) Notice: Subject to any disclaimer, the term of this patent is extended or adjusted under 35 U.S.C. 154(b) by 0 days.

(21) Appl. No.: 12/236,963

(22) Filed: Sep. 24, 2008

(65) Prior Publication Data

US 2010/0073036 A1    Mar. 25, 2010

(51) Int. Cl.
*H03B 1/00* (2006.01)
(52) U.S. Cl. .......................................... 327/108; 326/83
(58) Field of Classification Search .................... 326/82, 326/83, 86; 327/108–112
See application file for complete search history.

(56) References Cited

U.S. PATENT DOCUMENTS

| 5,617,043 | A * | 4/1997 | Han et al. .................... 326/83 |
| 5,874,837 | A * | 2/1999 | Manohar et al. ............. 326/83 |
| 6,025,742 | A * | 2/2000 | Chan ........................... 327/108 |
| 6,246,270 | B1 * | 6/2001 | Wang et al. .................. 327/111 |
| 6,628,150 | B1 * | 9/2003 | Carvajal et al. ............. 327/108 |
| 6,671,113 | B2 * | 12/2003 | Klaassen et al. ............ 360/46 |
| 7,233,165 | B2 * | 6/2007 | Jordy ........................... 326/29 |
| 7,250,793 | B2 | 7/2007 | Lu |
| 7,256,624 | B2 * | 8/2007 | Cheng et al. ................. 327/112 |
| 7,408,387 | B2 * | 8/2008 | Suenaga ....................... 327/108 |
| 7,508,236 | B2 * | 3/2009 | Lai et al. ..................... 326/86 |
| 7,696,787 | B2 * | 4/2010 | De Araujo et al. .......... 326/86 |
| 2001/0040466 | A1 | 11/2001 | Ide |
| 2003/0122593 | A1 | 7/2003 | Volk |
| 2005/0073338 | A1 | 4/2005 | Turcotte |
| 2006/0125533 | A1 | 6/2006 | Kim et al. |
| 2006/0217079 | A1 | 9/2006 | Yu et al. |
| 2006/0267634 | A1 | 11/2006 | Koo |
| 2008/0231329 | A1 * | 9/2008 | Lee et al. ..................... 327/108 |
| 2008/0246511 | A1 * | 10/2008 | Miura et al. ................. 326/83 |
| 2009/0033365 | A1 * | 2/2009 | Miura .......................... 326/82 |
| 2009/0167369 | A1 * | 7/2009 | Liu et al. ..................... 327/108 |
| 2009/0174439 | A1 * | 7/2009 | Luo et al. .................... 327/108 |
| 2011/0043259 | A1 * | 2/2011 | Luo et al. .................... 327/108 |

FOREIGN PATENT DOCUMENTS

EP            1434347 A1      6/2004

OTHER PUBLICATIONS

Mingden Chen, et al., "Low-Voltage Low-Power LVDS Drivers", IEEE Journal of Solid-State Circuits, vol. 40, No. 2, Feb. 2005, pp. 472-479.

* cited by examiner

*Primary Examiner* — Lincoln Donovan
*Assistant Examiner* — William Hernandez
(74) *Attorney, Agent, or Firm* — Moser Taboada (57) ABSTRACT

A system and a method for communicating data at a rate exceeding about a gigabit per second is described. The system may include circuitry and a current-sourcing module. The circuitry may include an output couplable to a load. The circuitry may output from the output a low voltage differential signal having a first current that drives the load from a first voltage at a first time to a second voltage at a second time. The current-sourcing module may apply a second current to the output at a third time, which occurs at about the first time.

34 Claims, 9 Drawing Sheets

HIGH-SPEED LOW-VOLTAGE DIFFERENTIAL SIGNALING SYSTEM

BACKGROUND

1. Field

The following generally relates to driver circuitry for performing high-speed data communication, and more particularly, to a low-voltage differential signaling ("LVDS") system for such high speed data communication.

2. Related Art

Resulting from tremendous growth of the internet, data transfers have dramatically increased, in terms of both volume and speed, in all fields of communication. For example, data streams of transmissions for digitized video signals and color graphics may now require bandwidth at rates in excess of one gigabit per second ("Gbps"). As a result, an interface of a receiver and/or transmitter (collectively "transceiver") for handling these transmissions has to be able to exchange ("i.e., send and/or receive") data at such rates.

Today's interface typically employs a Low-Voltage Differential Signaling ("LVDS") system. In general, the LVDS system includes two output terminals coupled to a load of the transceiver and circuitry for driving ("LVDS driver") a differential-output voltage across the two terminals, which in turn, drives a current flow across the load. During transmission, the differential-output voltage swings between two voltage levels of opposite polarity, which represents digitally encoded data being transmitted. The swing in the voltage levels, in turn, causes the polarity of the current flow across the load, which forms the data streams being transmitted.

As the rate of transmission approaches and/or exceeds 1 Gbps, capacitance present at the load of the legacy LVDS system, including parasitic capacitances such as board line capacitance, can no longer be treated as being negligible. That is, this capacitance limits rise and fall times of the swing in the differential output voltage, thereby distorting the digitally encoded data being transmitted so as to vitiate the differences between the two voltage levels. As a result, the legacy LVDS system is limited as to the rate at which the LVDS system can transmit data.

SUMMARY

A driver and a method for communicating data at a rate exceeding about a gigabit per second is provided. The driver may include circuitry and a current-sourcing module. The circuitry includes an output capable of being coupled to a load. The circuitry outputs a low voltage differential signal from the output. The low voltage differential signal includes a first current for driving the load from a first voltage at a first time to a second voltage at a second time. The current-sourcing module applies a second current to the output at a third time. The third time further occurs about the first time.

BRIEF DESCRIPTION OF THE DRAWINGS

So the manner in which the above recited features are attained and can be understood in detail, a more detailed description is described below with reference to Figures illustrated in the appended drawings.

The Figures in the appended drawings, like the detailed description, are examples. As such, the Figures and the detailed description are not to be considered limiting, and other equally effective examples are possible and likely. Furthermore, like reference numerals in the Figures indicate like elements, and wherein.

DETAILED DESCRIPTION

Figure 1:
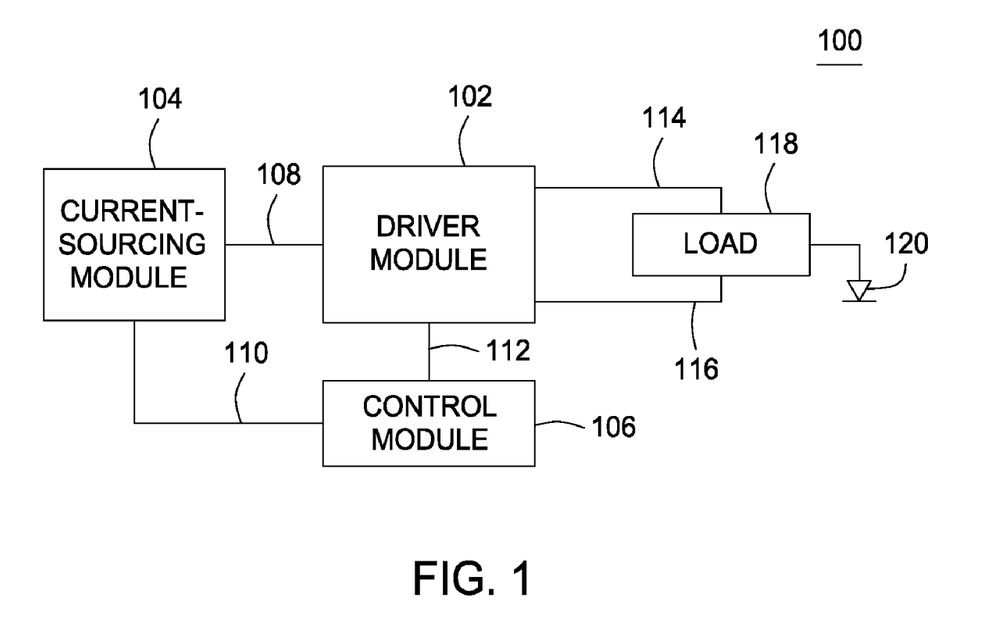
FIG. 1 is a block diagram illustrating an example high-speed Low Voltage Differential Signal ("LVDS") system.

FIG. 1 is a block diagram illustrating an example high-speed Low Voltage Differential Signal ("LVDS") system 100. The system 100 is operable to communicate data at rates approaching and/or exceeding one gigabit per second ("Gbps"). The system 100 may be included within, employed by or otherwise part of a receiver and/or transceiver (not shown). The system 100 may include a driver module 102, a current-sourcing module 104, and a control module 106. The driver module 102, the current-sourcing module 104, and the control module 106 are communicatively coupled to each other via links 108, 110 and 112.

The driver module 102 may include logic, such as electronic circuitry, and first and second output terminals 114, 116. The first and second output terminal 114, 116 may be communicatively coupled to a load 118 of the receiver and/or transceiver (collectively "transceiver"). The driver module 102, via its logic, may be configured to output to the first and second output terminals 114, 116 a low-voltage differential ("LVD") signal. When measured with respect to the reference 120, the LVD signal may include first and second states and a number of transitions between the first and second states. The first and second states may represent, for example, "1" and "0", respectively, of a digital encoding of a data stream for transmission. For simplicity of exposition, the first and second states may be referred to herein as "HI" and "LO" states, respectively. The HI state may be, for example, a first voltage or range of voltages having a first potential difference with respect to the reference 120, and such first voltage or range of voltages are designated to represent the "1" digital encoding. The LO state may be, for example, a second voltage or range of voltages having a second potential difference, if any, with respect to the reference 120, and such second voltage or range of voltages are designated to represent the "0" digital encoding. To differentiate between the HI and LO states, the second voltage or range of voltages is less than the first potential difference.

The transitions between the first and second states may include (i) a transition from the high state to the low state ("HI/LO transition") and (ii) a transition from the low state to the high state ("LO/HI transition"). Each of the transitions, whether such transition is the HI/LO transition or the LO/HI transition, may have a duration that is typically circumscribed, delimited or otherwise defined by a first time and a second time. These first and second times may occur, for example, at a start and an end, respectively, of the transition. Alternatively, the first and second times may occur at about (e.g., approximately the same time as, a relatively short time before and/or a relatively short time after) the start and the end, respectively, of the transition.

During operation, the driver module 102 may output to the first and second output terminals 114, 116 the LVD signal, which has a current for driving the load from the first state to the second state ("a first or 'driver' current"). This driver current may, for example, drive the load (i) from low state to the high state at the LO/HI transition, and/or (ii) from the high state to the low state at the HI/LO transition.

The current-sourcing module 104, as noted above, may be communicatively coupled to the circuitry 102, which includes, of course, being communicatively coupled to the first and second output terminals 114, 116. As described in more detail below, the current-sourcing module 104, such as one or more current sources, to source another current ("a second or 'boost' current") to drive the load from the first state to the second state during any of the transitions. The boost current may beneficially reduce the duration (i.e., a time between the first and second times) of such transitions as compared to the system 100 without the current-sourcing module 104 sourcing the boost current during the transitions.

The control module 106, like the driver module 102 and the current-sourcing module 104, may include logic (not shown) that may be configured to cause the circuitry 102 to generate the LVD signal. The control module 106, via its logic, may be further configured to cause the current-sourcing module 104 to source the boost current during any of the transitions.

Although not shown in FIG. 1, the logic of each of the driver module 102, current-boost module 104, and control module 106 may be implemented, deployed and/or fashioned in any number of forms. In any of these forms, the logic of the driver module 102, current-boost module 104, and control module 106, in whole or in part, may function to output the LVD signal having the driver current for driving the load from the first state at the first time to the second state at the second time, and provide the boost current for driving the load at a third time, which may occur about the first time. The examples that follow include just a few of a plethora of architectures for carrying out such function.

Figure 2:
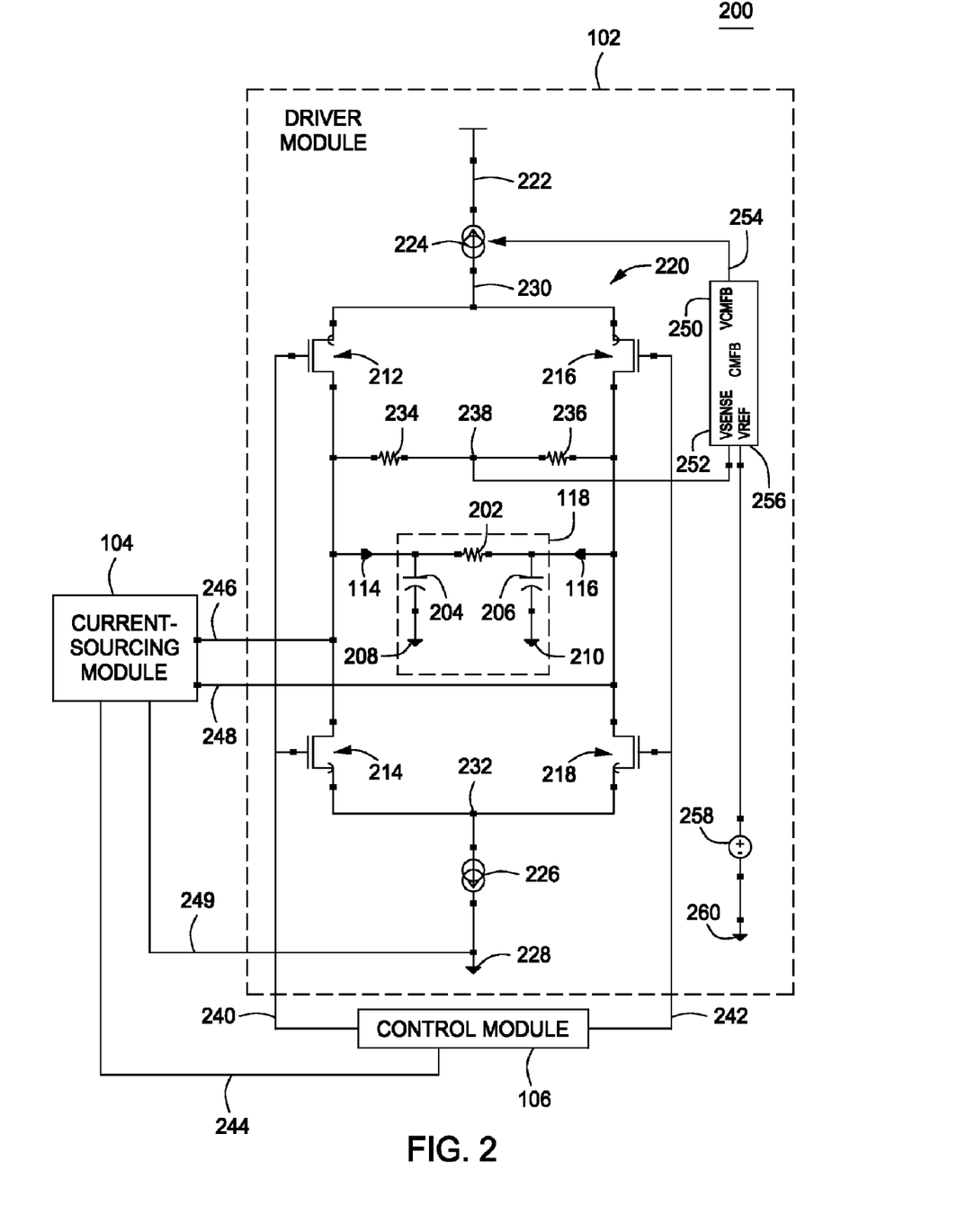
FIG. 2 is a block diagram illustrating another example high-speed LVDS system.

FIG. 2 is a block diagram illustrating an example high-speed LVDS system 200. The LVDS system 200 is similar to the system 100 of FIG. 1, except as described herein. Like the system 100, the system 200 may be included within, employed by or otherwise part of a receiver and/or transceiver (not shown).

The load 118 of the transceiver may include a resistor ("load resistor") 202, a first capacitor 204 and a second capacitor 206; each of which includes first and second terminals. The first terminals of the load resistor 202 and the first capacitor 204 communicatively couple to the first output terminal 114. The first terminal of the second capacitor 206 along with the second terminal of the load resistor 202 communicatively couple to the second output terminal 116. The second terminals of the first and second capacitors 204, 206 communicatively couple to respective first and second reference terminals 208, 210. The first and second reference terminals 208, 210 may communicatively couple or otherwise be placed at first and second reference voltages. The first and second reference voltages may be, for example, different ground potentials or, alternatively, the same ground potential.

In addition to the first and second output terminals 114, 116, the driver module 102 may include four switches, namely, a first switch 212, a second switch 214, a third switch 216 and a fourth switch 218. The four switches 212, 214, 216 and 218 are communicatively coupled so as to be arranged in a form of a bridge 220.

Each of the four switches 212, 214, 216 and 218 may be formed as a metal-oxide-semiconductor-field-effect transistor ("MOSFET"). The first and third switches 212, 216, for example, may be formed as P-channel MOSFETs ("p-MOSFETs") and the second and forth switches 214, 218 may be formed as N-channel MOSFETs ("n-MOSFETs"). The four switches 212, 214, 216 and 218 may take other forms as well, including, for example complementary-metal-oxide semiconductors ("CMOS") and/or bipolar junction transistors ("BJTs"). In addition, the driver module 102 may be formed using other combinations of n-MOSFETs, p-MOSFETs and/or other like-type devices.

Assuming, for simplicity of exposition, the first and third switches 212, 216 are p-MOSFETs and the second and fourth switches 214, 218 are n-MOSFETs, then each of the four switches 212, 214, 216 and 218 includes source, drain and gate terminals. To facilitate forming the bridge 220, the drain terminals of the first and second switches 212, 214 are communicatively coupled to the first output terminal 114, and the drain terminals of the third and fourth switches 216, 218 are communicatively coupled to the second output terminal 116. In addition, the source terminals of the first and third switches 212, 214 communicatively couple together, and the source terminals of the second and fourth switches 216, 218 communicatively couple together.

In addition to the four switches 212, 214, 216 and 218, the driver module 102 may include a third reference terminal 222, a first current source 224, a second current source 226 and a fourth reference terminal 228. The third reference terminal 222 may communicatively couple in series to the first current source 224, which communicatively couples to a first node 230 of the bridge 220. The first node 230, communicatively couples to the source terminals of the first and third switches 212, 214.

The second current source 226 communicatively couples to a second node 232 of the bridge 220. The second node 232, in turn, communicatively couples to the source terminals of the second and fourth switches 214, 218. The second current source 226 also communicatively couples to the fourth reference terminal 228.

The fourth reference terminal 228 may communicatively couple or otherwise be placed at a fourth reference voltage, such as a ground. The third reference terminal 222 may be placed at a third reference voltage, namely vdd. The third reference voltage vdd may have a potential difference above and/or below the fourth reference voltage.

The driver module 102 may also include two resistors, namely first and second resistors 234, 236. The first and second resistors 234, 236 communicatively couple in series between (i) the drain terminals of the first and third switches 212 and 216, and (ii) the drain terminals of the second and fourth switches 214 and 218. To facilitate this, the first and second resistors 234, 236 may include respective first and second terminals. The first terminal of the first resistor 234 may communicatively couple to the drain terminals of the first and second switches 212 and 214. The second terminal of the first resistor 234 may communicatively couple to the first terminal of the second resistor 236, and the second terminal of the second resistor 236 may communicatively couple to the drain terminals of the third and fourth switches 216, 218.

The control module 106 communicatively couples to the gate terminals of the first and second switches 212, 214, via a first link 240; and to the third and fourth switches 216, 218, via a second link 242. The control module 106 also communicatively couples to the current-sourcing module 104 via a third link 244.

The current-sourcing module 104, in turn, communicatively couples to (i) the drain terminals of the first and second switches 212, 214 (and/or the first output terminal 114) via a fourth link 246, and (ii) the drain terminals of the third and forth switches 216, 218 (and/or the second output terminal 116) via a fifth link 248. The current-sourcing module 104 may also communicatively couple to the fourth reference terminal 228, via a sixth link 249.

In addition to the driver module 102, the current-sourcing module 104 and the control module, the system 200 may include common-mode-feedback ("CMFB") module 250. The CMFB module 260 to sense a voltage present on node 238 and provide feedback to control the first current source 224.

To facilitate this, the CMFB module 250 include a first input 252 communicatively coupled to the node 238, an output 254 for controlling the first current source 224 responsive the voltage garnered from the node 238, and a second input 256 communicatively coupled to a positive terminal of a voltage source 258. A negative terminal of the voltage source 258 is connected to a fifth reference terminal 260. The fifth reference terminal 260 may communicatively couple or otherwise be placed at a fifth reference voltage, such as a ground. The third and fifth reference terminals 228 and 260 may be placed at the same ground potential to avoid undesired current loops.

In operation, the control module 106 may provide, via the link 240, a first control signal $V_{CLK\_P}$ for driving the first and second switches 212, 214. The control module 106 may also provide, via the link 242, a second control signal $V_{CLK\_N}$ for driving the third and fourth switches 216, 218. The first and second control signals $V_{CLK\_P}$, $V_{CLK\_N}$ may be timing, clock or like-type signals that transition between high and low states periodically.

The control module 106 may provide the first control signal $V_{CLK\_P}$ so that it is or is or is about 180 degrees out of phase from the second control signal $V_{CLK\_N}$. This way, when the first control signal $V_{CLK\_P}$ is in a high state the second control signal $V_{CLK\_N}$ is in a low state, and vice versa.

When the first and second control signals $V_{CLK\_P}$, $V_{CLK\_N}$ are in high and low states, respectively, the second and third switches 214, 216 are in a conducting state ("ON") and the first and fourth switches 212, 218 and not in a conducting state ("OFF"). In these states, a current $I_{OUT\_P}$ (i.e., a first instance of the driver current) flows across the output resistor 202 from the second output terminal 116 to the first output terminal 114, resulting in an output voltage $V_{OUT\_P}$ at the second output terminal 116, an output voltage $V_{OUT\_N}$ at the first output terminal 114, and a differential-output voltage ΔV. The differential-output voltage ΔV is formed as a function of $V_{OUT\_P}$-$V_{OUT\_N}$, which, in this case, the differential-output voltage ΔV has a positive polarity, and is in the HI state.

Analogously, when the first and second control signals $V_{CLK\_P}$, $V_{CLK\_N}$ are in low and high states, respectively, the second and third switches 214, 216 are OFF and the first and fourth switches 212, 218 are ON. In these states, a current $I_{OUT\_N}$ (i.e., a second instance of the driver current) flows across the output resistor 202 from the first output terminal 114 to the second output terminal 116. The differential-output voltage ΔV in this case has a negative polarity, and is in the LO state.

To facilitate the LO/HI transition, the control module 106 causes (i) the first control signal $V_{CLK\_P}$ to transition from the low state to the high state, and (ii) the second control voltage $V_{CLK\_N}$ to transition from the high state to the low state. This in turn, triggers or otherwise causes (collectively "causes") (i) the second and third switches 214, 216 to switch from OFF to ON and (ii) the first and fourth switches 212, 218 to switch from ON to OFF. The output voltage $V_{OUT\_N}$, in turn, transitions from the HI state to the LO state, and the output voltage $V_{OUT\_P}$ transitions from the LO state to the HI state. Responsively, the differential-output voltage ΔV undergoes the LO/HI transition.

At some time during the LO/HI transition (e.g., about the same time as the first time), the control module 106 causes the current-sourcing module 104 to source a first instance of the boost current $I_{OUT\_N\_BOOST}$ or otherwise cause an increase in the output load current at the first output terminal 114 by applying the first instance of the boost current $I_{OUT\_N\_BOOST}$ during the LO/HI transition. To facilitate triggering the current-sourcing module 104, the control module 106 may issue, via the link 244, a first booster-control signal $V_{BOOST\_CLK\_P}$. The first booster-control signal $V_{BOOST\_CLK\_P}$, in turn, may be triggered by a leading edge of a given step of the first control signal $V_{CLK\_P}$, for instance.

By sourcing the first instance of the boost current $I_{OUT\_N\_BOOST}$ at the first output terminal 114, the output voltage $V_{OUT\_N}$ transitions from the HI state to the LO state more rapidly than would occur without the addition of the first instance of the boost current $I_{OUT\_N\_BOOST}$. Such transition, in turn, causes the differential-output voltage ΔV to undergo the LO/HI transition more rapidly than would occur without the addition of the first instance of the boost current $I_{OUT\_N\_BOOST}$.

To facilitate the HI/LO transition, the control module 106 causes (i) the first control signal $V_{CLK\_P}$ to transition from the high state to the low state, and (ii) the second control voltage $V_{CLK\_N}$ to transition from the low state to the high state. This in turn, causes (i) the second and third switches 214, 216 to switch from ON to OFF, and (ii) the first and fourth switches 212, 218 to switch from OFF to ON. The output voltage $V_{OUT\_N}$, in turn, transitions from the LO state to the HI state, and the output voltage $V_{OUT\_P}$ transitions from the HI state to the LO state. Responsively, the differential-output voltage ΔV undergoes the HI/LO transition.

At some time during the HI/LO transition (e.g., about the same time as the first time), the control module 106 causes the current-sourcing module 104 to source a second instance of the boost current $I_{OUT\_P\_BOOST}$ or otherwise cause an increase in the output load current at the second output terminal 116 by applying the second instance of the boost current $I_{OUT\_P\_BOOST}$ during the HI/LO transition. To facilitate triggering the current-sourcing module 104, the control module 106 may issue, via the link 244, a second booster-control signal $V_{BOOST\_CLK\_N}$. The second booster-control signal $V_{BOOST\_CLK\_N}$, in turn, may be triggered by a leading edge of a given step of the first control signal $V_{CLK\_N}$.

By sourcing the second instance of the boost current $I_{OUT\_P\_BOOST}$ at the second output terminal 116, the output voltage $V_{OUT\_P}$ transitions from the HI state to the LO state more rapidly than would occur without the addition of the second instance of the boost current $I_{OUT\_P\_BOOST}$. Such transition, in turn, causes the differential-output voltage ΔV to undergo the HI/LO transition more rapidly than would occur without the addition of the second instance of the boost current $I_{OUT\_P\_BOOST}$.

Figure 3:
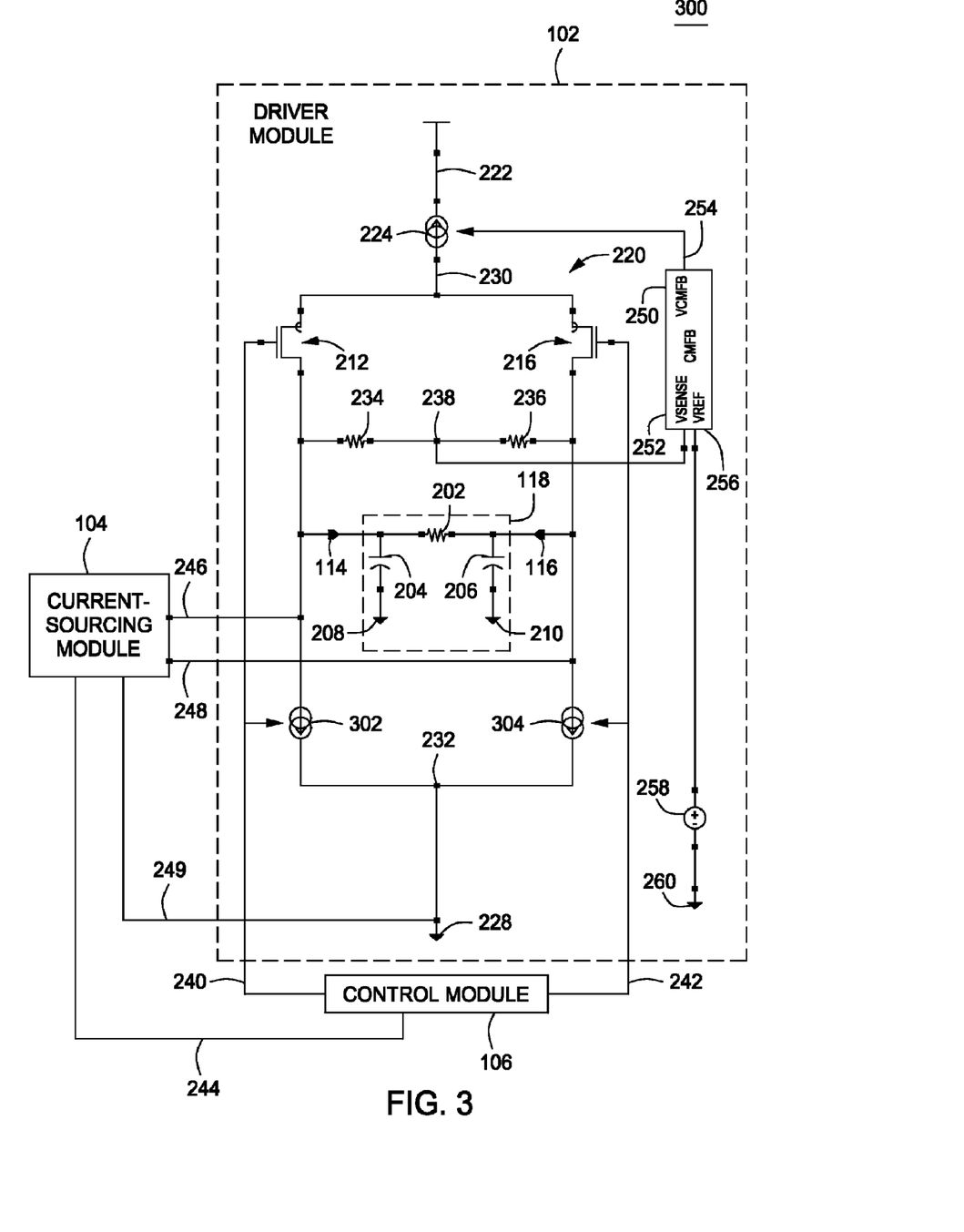
FIG. 3 is a block diagram illustrating another example high-speed LVDS system.

FIG. 3 is a block diagram illustrating another example high-speed LVDS system 300. The LVDS system 300 is similar to the system 200 of FIG. 2, except as described herein. Like the system 200, the system 300 may be included within, employed by or otherwise part of a receiver and/or transceiver (not shown).

The system 300 of FIG. 3 differs from system 200 of FIG. 2 in that (i) the second and fourth switches 214, 218 are replaced by third and fourth switchable current sources 302, 304, respectively; (ii) the current source 226 is removed; and (iii) the node 232 communicatively couples to the fourth reference terminal 228. In operation, the system 300 of FIG. 3 may function analogously to system 200 of FIG. 2.

For example, the control module 106 may provide (i) the first control signal $V_{CLK\_P}$ via the link 240, for driving the first switch 212 and the third switchable current source 302 between OFF and ON; and (ii) the second control signal $V_{CLK\_N}$, via the link 242, for driving the third switch 216 and the fourth switchable current source 304 between OFF and ON. When the first and second control signals $V_{CLK\_P}$, $V_{CLK\_N}$ are in high and low states, respectively, the third switch 216 and the third switchable current source 302 are ON, and the first switch 212 and the fourth switchable current source 304 are OFF. In these states, the current $I_{OUT\_P}$ flows across the output resistor 202 from the second output terminal 116 to the first output terminal 116, resulting in the output voltage $V_{OUT\_P}$ at the second output terminal 114, the output voltage $V_{OUT\_N}$ at the first output terminal 114, and the differential-output voltage ΔV. As above, the differential-output voltage ΔV in this case has a positive polarity, and is in the HI state.

Analogously, when the first and second control signals $V_{CLK\_P}$, $V_{CLK\_N}$ are in low and high states, respectively, the third switch 216 and the third switchable current source 302 are OFF, and the first switch 212 and the fourth switchable current source 304 are ON. In these states, the current $I_{OUT\_N}$ flows across the output resistor 202 from the first output terminal 114 to the second output terminal 116. The differential-output voltage ΔV in this case has a negative polarity, and is in the LO state.

To facilitate the LO/HI transition, the control module 106 causes (i) the first control signal $V_{CLK\_P}$ to transition from the low state to the high state, and (ii) the second control voltage $V_{CLK\_N}$ to transition from the high state to the low state. This in turn, causes (i) the third switchable current source 302 and the third switch 216 to switch from OFF to ON, and (ii) the first switch 212 and the fourth switchable current source 304 to switch from ON to OFF. The output voltage $V_{OUT\_N}$, in turn, transitions from the HI state to the LO state, and the output voltage $V_{OUT\_P}$ transitions from the LO state to the HI state. Responsively, the differential-output voltage ΔV undergoes the LO/HI transition.

At some time during the LO/HI transition (e.g., about the same time as the first time), the control module 106 causes the current-sourcing module 104 to source the first instance of the boost current $I_{OUT\_N\_BOOST}$ or otherwise cause the increase in the output load current at the first output terminal 114 by applying the first instance of the boost current $I_{OUT\_N\_BOOST}$ during the LO/HI transition. As above, sourcing the first instance of the boost current $I_{OUT\_N\_BOOST}$ causes the output voltage $V_{OUT\_N}$ to transition from the HI state to the LO state more rapidly than would occur without the addition of the first instance of the boost current $I_{OUT\_N\_BOOST}$. Such transition, in turn, causes the differential-output voltage ΔV to undergo the LO/HI transition more rapidly than would occur without the addition of the first instance of the boost current $I_{OUT\_N\_BOOST}$.

To facilitate the HI/LO transition, the control module 106 causes (i) the first control signal $V_{CLK\_P}$ to transition from the high state to the low state, and (ii) the second control voltage $V_{CLK\_N}$ to transition from the low state to the high state. This in turn, causes (i) the third switchable current source 302 and the third switch 216 to switch from ON to OFF, and (ii) the first switch 212 and the fourth switchable current source 304 to switch from OFF to ON. The output voltage $V_{OUT\_N}$, in turn, transitions from the LO state to the HI state, and the output voltage $V_{OUT\_P}$ transitions from the HI state to the LO state. Responsively, the differential-output voltage ΔV undergoes the HI/LO transition.

At some time during the HI/LO transition (e.g., about the same time as the first time), the control module 106 causes the current-sourcing module 104 to source the second instance of the boost current $I_{OUT\_P\_BOOST}$ or otherwise cause an increase in the output load current at the second output terminal 116 by applying the second instance of the boost current $I_{OUT\_P\_BOOST}$ during the HI/LO transition. As above, sourcing the second instance of the boost current $I_{OUT\_P\_BOOST}$ causes the output voltage $V_{OUT\_N}$ to transition from the LO state to the HI state more rapidly than would occur without the addition of the second instance of the boost current $I_{OUT\_P\_BOOST}$. Such transition, in turn, causes the differential-output voltage ΔV to undergo the HI/LO transition more rapidly than would occur without the addition of the second instance of the boost current $I_{OUT\_P\_BOOST}$.

Figure 4:
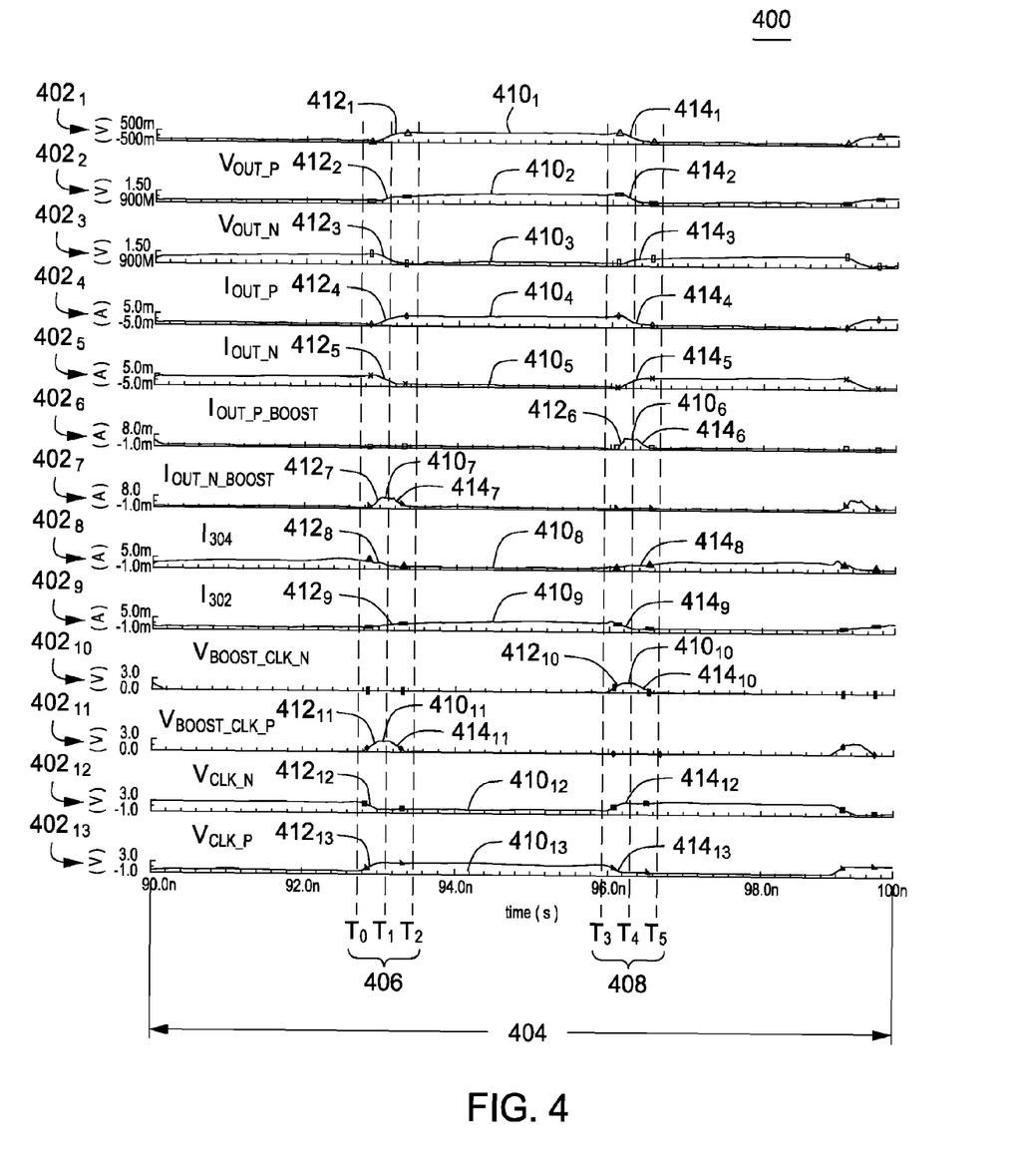
FIG. 4 is a graphical diagram illustrating an example collection of waveforms corresponding to signals associated with a high-speed LVDS system.

FIG. 4 is a graphical diagram illustrating an example collection of waveforms 400 corresponding to signals associated with a high-speed LVDS system. For convenience, the example collection of waveforms 400 is described with reference to an operation of system 300 of FIG. 3.

As shown, the collection of waveforms 400 includes thirteen waveforms, namely waveforms $402_{1-13}$. These waveforms $402_{1-13}$ respectively correspond to signals formed, over a given time period 404, from the differential-output voltage ΔV, output $V_{OUT\_P}$, output $V_{OUT\_N}$, first instance of the driver current $I_{OUT\_P}$, second instance of the driver current $I_{OUT\_N}$, first instance of the boost current $I_{OUT\_P\_BOOST}$, second instance of the boost current $I_{OUT\_N\_BOOST}$, $I_{302}$, $I_{304}$, first booster-control signal $V_{BOOST\_CLK\_P}$, second booster-control signal $V_{BOOST\_CLK\_N}$, first control signal $V_{CLK\_P}$ and second control signal $V_{CLK\_N}$. The waveforms $402_{1-13}$ are plotted with respect to time and appropriate measurement units (e.g., volts for ΔV, $V_{OUT\_P}$, $V_{OUT\_N}$, $V_{BOOST\_CLK\_N}$, $V_{BOOST\_CLK\_P}$, $V_{CLK\_N}$ and $V_{CLK\_N}$ signals, and amperes for the $I_{OUT\_P}$, $I_{OUT\_N}$, $I_{OUT\_P\_BOOST}$, $I_{OUT\_N\_BOOST}$, $I_{302}$ and $I_{304}$ signals.).

Each of the waveforms $402_{1-13}$ include first and second transient responses 406, 408 corresponding to the LO/HI and HI/LO transitions, respectively. The first transient responses 406 are circumscribed by times $T_0$-$T_2$ and the second transient responses 408 are circumscribed by times $T_3$-$T_5$. In addition, the waveforms $402_{1-13}$ include respective steps $410_{1-13}$ having respective leading and trailing edges $412_{1-13}$, $414_{1-13}$.

Between times $T_0$-$T_1$, the first control signal $V_{CLK\_P}$ transitions from the low state to the high state, as indicated by the leading edge $412_{13}$, and the second control signal $V_{CLK\_N}$ transitions from the high state to the low state, as indicated by the leading edge $412_{12}$.

Responsive to the transition of the first control signal $V_{CLK\_P}$, the first switch 212 switches OFF, and the third switchable current source 302 switches ON causing the current $I_{302}$ to flow from the third switchable current source 302 to the fourth reference terminal 228 in increasing amounts, as indicated by the leading edge $412_9$ between times $T_0$-$T_2$. Responsive to the transition of the second control signal $V_{CLK\_N}$, the third switch 216 switches ON, and the fourth switchable current source 304 switches OFF causing the current $I_{304}$ to flow from the fourth switchable current source 304 to the fourth reference terminal 228 in decreasing amounts, as shown by leading edge $412_8$ between times $T_0$-$T_2$.

As indicated by the leading edge $412_5$ between times $T_0$-$T_2$, the second instance of the driver current $I_{OUT\_N}$ flowing across the output resistor 202 from the first output terminal 114 to the second output terminal 116 decreases in amount responsive to the transitions of the first and second control signals $V_{CLK\_P}$, $V_{CLK\_N}$. Conversely, the first instance of the driver current $I_{OUT\_P}$ flows across the output resistor 202 from the second output terminal 116 to the first output terminal 114 in increasing amounts, indicated by the leading edge $412_6$ between times $T_0$-$T_2$.

Correspondingly, the output voltage $V_{OUT\_N}$ transitions from the high state to the low state and the output voltage $V_{OUT\_P}$ transitions from the low state to the high state, as indicated by the leading edges $412_3$, $412_2$, respectively, between times $T_0$-$T_2$. In turn, the differential-output voltage $\Delta V$ begins to undergo the LO/HI transition, as indicated by the leading edge $412_1$ between times $T_0$-$T_1$.

As indicated by the leading edge $412_{11}$ between the times $T_0$-$T_1$, the first booster-control signal $V_{BOOST\_CLK\_P}$ transitions from the low state to the high state responsive to the transition of the first control signal $V_{CLK\_P}$. The transition of the first booster-control signal $V_{BOOST\_CLK\_P}$ causes the current-sourcing module 104 to source the first instance of the boost current $I_{OUT\_P\_BOOST}$, as indicated by the leading edge $412_7$. Responsive to this transition, both the first instance of the driver current $I_{OUT\_P}$ and the first instance of the boost current $I_{OUT\_P\_BOOST}$ flow to the first output terminal 114, which in turn causes the differential-output voltage $\Delta V$ to undergo the LO/HI transition more rapidly than would occur without the addition of the first instance of the boost current $I_{OUT\_P\_BOOST}$.

Between times $T_3$-$T_5$, the first control signal $V_{CLK\_P}$ transitions from the high state to the low state, as indicated by the trailing edge $414_{13}$; and the second control signal $V_{CLK\_N}$ transitions from the low state to the high state, as indicated by the trailing edge $414_{12}$.

Responsive to the transition of the first control signal $V_{CLK\_P}$, the first switch 212 switches ON, and the third switchable current source 302 switches OFF causing the current $I_{302}$ to flow from the third switchable current source 302 to the fourth reference terminal 228 in decreasing amount, as indicated by the trailing edge $414_9$ between times $T_3$-$T_5$. Responsive to the transition of the second control signal $V_{CLK\_N}$, the third switch 216 switches OFF, and the fourth switchable current source 304 switches ON causing the current $I_{304}$ to flow from the fourth switchable current source 304 to fourth reference terminal 228 in increasing amounts, as shown by tailing edge $414_8$ between times $T_3$-$T_5$.

As indicated by the trailing edge $414_5$ between times $T_3$-$T_5$, the second instance of the driver current $I_{OUT\_N}$ flows across the output resistor 202 from the first output terminal 114 to the second output terminal 116 in increasing amounts responsive to the transitions of the first and second control signals $V_{CLK\_P}$, $V_{CLK\_N}$. Conversely, the first instance of the driver current $I_{OUT\_N}$ flowing across the output resistor 202 from the second output terminal 116 to the first output terminal 114 decreases in amounts, indicated by the trailing edge $414_6$ between times $T_3$-$T_5$.

Correspondingly, the output voltage $V_{OUT\_N}$ transitions from the low state to the high state and the output voltage $V_{OUT\_P}$ transitions from the high state to the low state, as indicated by the trailing edges $414_3$, $414_2$, respectively, between times $T_3$-$T_5$. In turn, the differential-output voltage $\Delta V$ begins to undergo the HI/LO transition, as indicated by the trailing edge $414_1$ between times $T_3$-$T_4$.

As indicated by the trailing edge $414_{11}$ between the times $T_3$-$T_4$, the second booster-control signal $V_{BOOST\_CLK\_N}$ transitions from the low state to the high state responsive to the transition of the first control signal $V_{CLK\_P}$. The transition of the second booster-control signal $V_{BOOST\_CLK\_N}$ causes the current-sourcing module 104 to source the second instance of the boost current $I_{OUT\_N\_BOOST}$, as indicated by the trailing edge $414_7$. Responsive to this transition, both the second instance of the driver current $I_{OUT\_N}$ and the second instance of the boost current $I_{OUT\_N\_BOOST}$ flow to the second output terminal 116, which in turn causes the differential-output voltage $\Delta V$ to undergo the HI/LO transition more rapidly than would occur without the addition of the second instance of the boost current $I_{OUT\_N\_BOOST}$.

Figure 5:
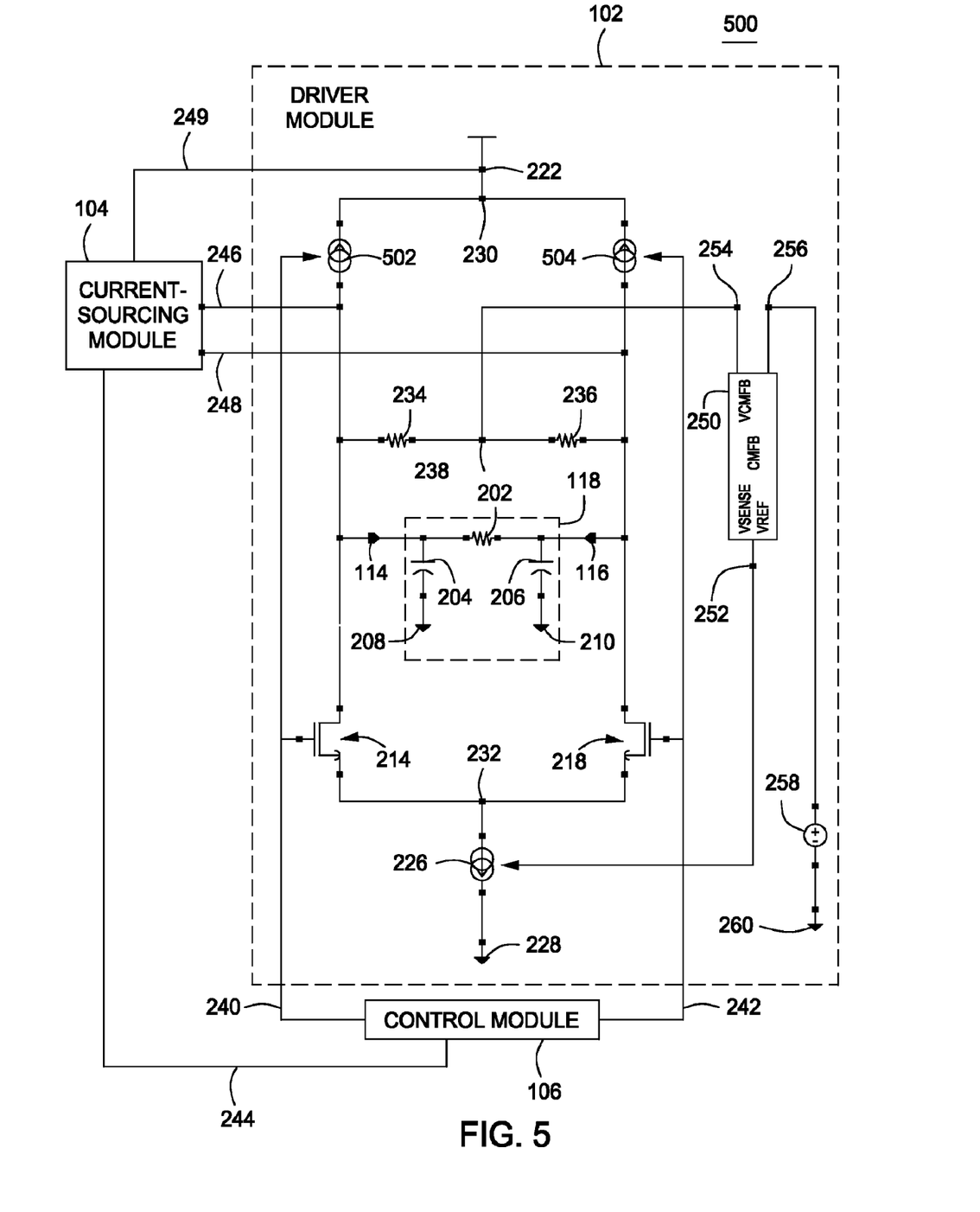
FIG. 5 is a block diagram illustrating another example high-speed LVDS system.

Referring now to FIG. 5, a block diagram illustrating another example a high-speed LVDS system 500 is shown. The LVDS system 500 is similar to the system 200 of FIG. 2, except as described herein. Like the system 200, the system 500 may be included within, employed by or otherwise part of a receiver and/or transceiver (not shown).

The system 500 of FIG. 5 differs from the system 200 of FIG. 2 in that the first and third switches 212, 216 are replaced with the fifth and sixth switchable current sources 502, 504. In addition, the first current source 224 is removed, and the node 222 communicatively couples to the fifth reference terminal 230. Further, the CMFB module 250 communicatively couples to the second switchable current source 226. In operation, the system 500 functions the same or analogously to system 200 of FIG. 2 and/or the system 300 of FIG. 3.

Figure 6:
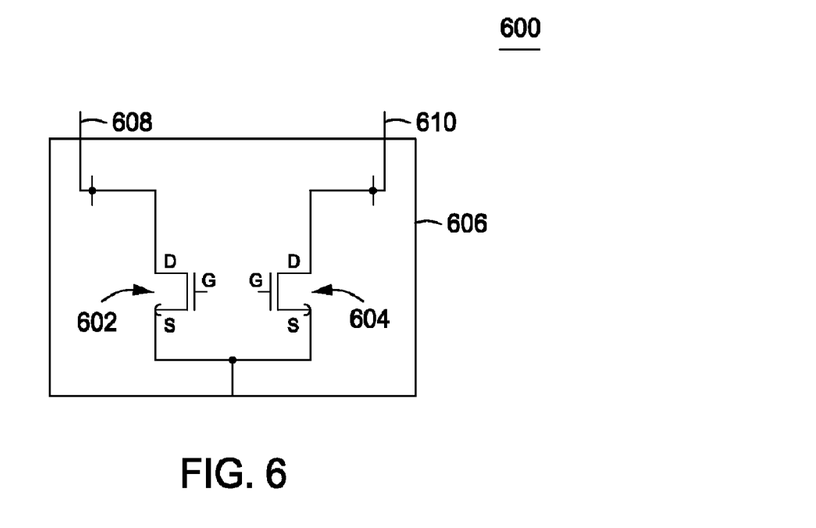
FIG. 6 is a schematic diagram illustrating an example current-sourcing module of a high-speed LVDS system.

FIG. 6 is a schematic diagram illustrating an example current-sourcing module 600. The current-sourcing module 600 may be or embody the current-sourcing module 104 of any of the high-speed LVDS systems 200, 300, 500 and 800 of FIGS. 2, 3, 5 and 8, respectively.

The current-sourcing module 600 may include fifth and sixth switches 602, 604. As shown, the fifth and sixth switches 602, 604 may be formed, for example, as n-MOSFETs. These fifth and sixth switches 602, 604, however, may be formed as p-MOSFETS. In addition, the current-sourcing module 600 may include other combinations of n-MOSFETS and p-MOSFETs, and/or like-type devices.

The fifth and sixth switches 602, 604 may be communicatively connected at their source terminals to a first output 606 of the current-sourcing module 104. The drain terminal of the fifth switch 602 is connected to a second output 608 of the current-sourcing module 104, and the drain terminal of the sixth switch 604 is connected to a third output 610 of the current-sourcing module 104. As described in more detail below with respect to FIG. 8, each of the fifth and sixth switches 602 and 604 may function as a switchable current source by prohibiting a current flow through when OFF, and by allowing a current flow through when ON.

Figure 7:
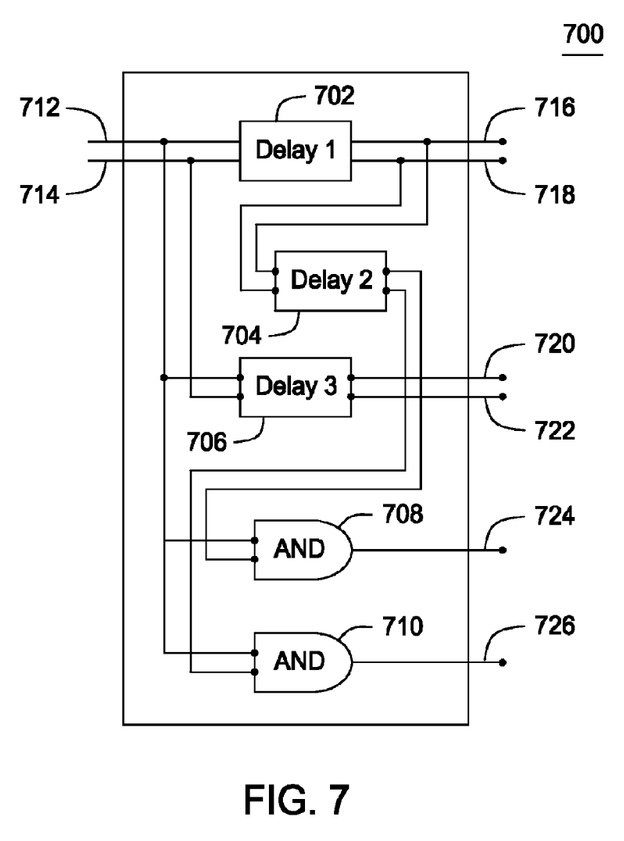
FIG. 7 is a schematic diagram illustrating an example control module of a high-speed LVDS system.

FIG. 7 is a schematic diagram illustrating an example control module 700. The control module 700 may be or embody the control module 106 of any of the high-speed LVDS systems 200, 300, 500 and 800 of FIGS. 2, 3, 5 and 8, respectively.

The control module 106 may include three delay circuits, namely a first delay circuit 702, a second delay circuit 704 and a third delay circuit 706; along with first and second AND gates 708, 710. The control module 106 may also include first and second input lines 712, 714, and first, second, third, fourth, fifth and sixth output lines 716-726.

The first and second input lines 712, 714 communicatively couple to respective inputs of the first and third delay circuits

702, 706. The first input line 712 also communicatively couples to respective inputs of the first AND gate 708 and the second AND gate 710. First and second outputs of the first delay circuit 702 communicatively couple to the first and second output lines 716, 718, respectively. First and second inputs of the second delay circuit 706 also communicatively couple to the first and second output lines 716, 718, respectively. A first output of the second delay circuit 704 communicatively couples to a second input of the first AND gate 708, and a second output of the second delay circuit 704 communicatively couples to a second input of the second AND gate 710.

First and second outputs of the third delay circuit 706 communicatively couple to the third and fourth output lines 720, 722. An output of the first AND gate 708 communicatively couples to the fifth output line 724, and an output of the second AND gate 710 communicatively couples to the sixth output line 726.

In operation, the control module 700 may receive a first input signal on the first input line 712, and a second input signal on the second input line 714. The first delay circuit 702 may, in turn, generate a first control signal and output such control signal to the first output line 716. The first delay circuit 702 may also generate a second control signal and output such control signal to the second output line 718. The first delay circuit 702 may generate the first and second control signals by respectively shifting the first and second input signals by a first phase.

The third delay circuit 706, responsive to the first and second input signals, may generate and output to the third and fourth output lines 720, 722 third and fourth control signals. The third delay circuit may, for example, generate the third and fourth control signals by shifting the first and second input signals by a second phase. This second phase is generally the same or about the same as the first phase. The second phase may, however, be different from the first phase. Such differences may be attributed to differences in circuitry that the third and fourth control signals interface with.

The second delay circuit 704, responsive to the first and second control signals, may generate first and second intermediate signals and output such intermediate signals to the second inputs of the first and second AND gates 708, 710, respectively. The second delay circuit 704 may generate the first and second intermediate circuits by shifting the first and second control signals by a third phase.

Responsive to a logical AND operation to the first input signal and the first intermediate signal, the first AND gate 708 may generate and output the first booster-control signal $V_{BOOST\_CLK\_P}$ to the fifth output line 724. Analogously, the second AND gate 710 may generate and output such the second booster-control signal $V_{BOOST\_CLK\_N}$ to the sixth output line 726 responsive to a logical AND operation to the first input signal and the second intermediate signal.

Figure 8:
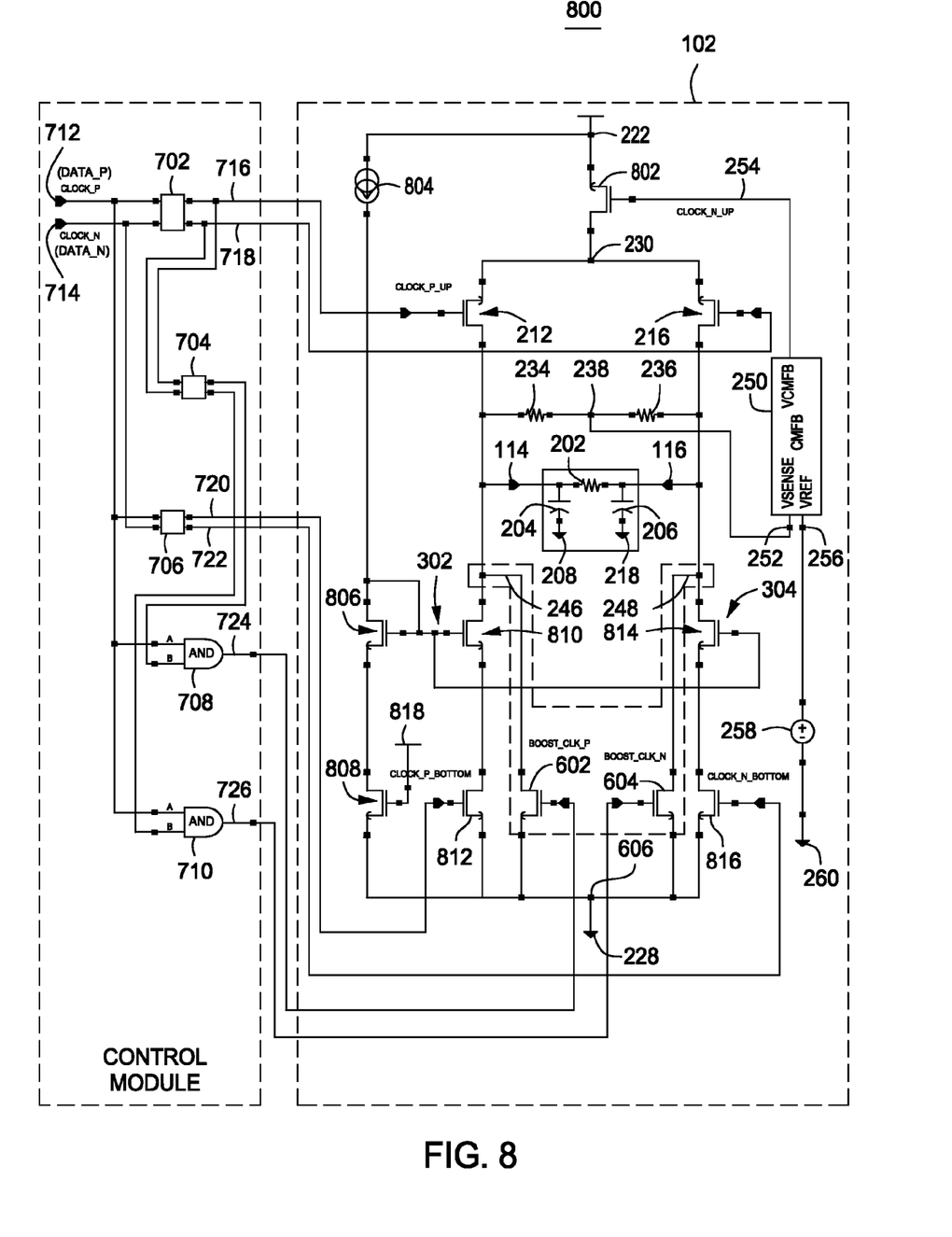
FIG. 8 is schematic diagram illustrating another example high-speed LVDS system.

Referring now to FIG. 8, a schematic diagram illustrating an example high-speed LVDS system 800 is shown. The LVDS system 800 is similar to the system 300 of FIG. 3, except as described herein. Like the system 300, the system 800 may be included within, employed by or otherwise part of a receiver and/or transceiver (not shown).

The system 800 of FIG. 8 differs from the system 300 of FIG. 3 in that the current-sourcing module 600 of FIG. 6 replaces the current-sourcing module 104 of the system 300 of FIG. 3, and the control module 700 of FIG. 7 replaces the control module 106 of the system 300 of FIG. 3. In addition, a seventh transistor 802 operates as the first current source 224 of the system of FIG. 3.

The third switchable current source 302 is formed from a current source 804 and eighth, ninth, tenth and eleventh transistors 806, 808, 810 and 812. The fourth switchable current source 304 is formed from the current source 804, the eighth transistor 806, ninth transistor 808, twelfth transistor 814 and thirteenth transistor 816. Assuming, for simplicity of exposition, the eighth-thirteenth switches 806-816 are n-MOS-FETs, then each of these transistors 806-816 includes source, drain and gate terminals.

To facilitate forming the third switchable current source 302, the drain terminal of the first switch 212 communicatively couples to the drain terminal of tenth transistor 810, and the source terminal of tenth transistor 810 communicatively couples to the drain terminal of eleventh transistor 812. In addition, the current source 804 communicatively couples to the drain terminal of the eighth transistor 806 and to each of the gate terminals of the eighth and tenth transistors 806, 810. Further, the source terminal of the eighth transistor 806 communicatively couples to the drain terminal of the ninth transistor 808. The gate terminal of the ninth transistor 808 communicatively couples to a sixth reference terminal 818. The gate and the source terminals of the eleventh transistor 812 communicatively couple to the third output line 720 and fourth reference terminal 228, respectively.

To facilitate forming the fourth switchable current source 302, the drain terminal of third switch 216 communicatively couples to the drain terminal of twelfth transistor 814, and the source terminal of twelfth transistor 814 communicatively couples to the drain terminal of the thirteenth transistor 816. In addition, the gate of the twelfth transistor 814 communicatively couples to the current source 804. Further, the gate and the source terminals of the thirteenth transistor 818 communicatively couple to the fourth output line 722 and fourth reference terminal 228, respectively.

Responsive the first and second input signals, the first delay circuit 702 may provide (i) the first control signal, via the first output line 716, to drive the first switch 212 between OFF and ON; and (ii) the second control signal, via the second output line 718, to drive the third switch 216 between OFF and ON. Analogously, the third delay circuit 706, responsive to the first and second input signals, may provide (i) the third control signal, via the third output line 720, to drive the eleventh switch 812 between OFF and ON; and (ii) the fourth control signal, via the fourth output line 722, to drive the thirteenth switch 816 between OFF and ON.

When the first and third control signals are in high states and when second and fourth control signals are in the low states, the third switch 216 and the third switchable current source 302 are ON, and the first switch 212 and the fourth switchable current source 304 are OFF. In these states, the current $I_{OUT\_P}$ flows across the output resistor 202 from the second output terminal 116 to the first output terminal 114, resulting in the output voltage $V_{OUT\_P}$ at the second output terminal 116, the output voltage $V_{OUT\_N}$ at the first output terminal 114, and the differential-output voltage $\Delta V$. The differential-output voltage $\Delta V$ in this case has a positive polarity, and is in the HI state.

Analogously, when the first and third control signals are in low states and when second and fourth control signals are in the high states, the third switch 216 and the third switchable current source 302 are OFF, and the first switch 212 and the fourth switchable current source 304 are ON. In these states, the current $I_{OUT\_N}$ flows across the output resistor 202 from the first output terminal 114 to the second output terminal 116. The differential-output voltage $\Delta V$ in this case has a negative polarity, and is in the LO state.

To facilitate the LO/HI transition, the control module 106 causes (i) the first and third control signals to transition from the low state to the high state, and (ii) the second and fourth control signals to transition from the high state to the low state. This in turn, causes (i) the third switchable current source 302 and the third switch 216 to switch from OFF to ON, and (ii) the first switch 212 and the fourth switchable current source 304 to switch from ON to OFF. The output voltage $V_{OUT\_N}$, in turn, transitions from the HI state to the LO state, and the output voltage $V_{OUT\_P}$ transitions from the LO state to the HI state. Responsively, the differential-output voltage $\Delta V$ begins to undergo the LO/HI transition.

Responsive to the first and second control signals, the second delay circuit 704 provides the first and second intermediate signals to the first and second AND gates 708, 710. The first and second AND gates 708, 710, in turn, provide the first and second booster-control signals $V_{BOOST\_CLK\_P}$, $V_{BOOST\_CLK\_N}$ to the fifth and sixth switches 602, 604, via the fifth and sixth output lines 724, 726. The first booster-control signals $V_{BOOST\_CLK\_P}$, cause the fifth switch 602, to switch ON, which in turn, sources the first instance of the boost current $I_{OUT\_P\_BOOST}$ or otherwise cause the increase in the output load current at the first output terminal 114 by applying the first instance of the boost current $I_{OUT\_P\_BOOST}$. As above, sourcing the first instance of the boost current $I_{OUT\_P\_BOOST}$ causes the output voltage $V_{OUT\_N}$ to transition from the HI state to the LO state more rapidly than would occur without the addition of the first instance of the boost current $I_{OUT\_P\_BOOST}$. Such transition, in turn, causes the differential-output voltage $\Delta V$ to undergo the LO/HI transition more rapidly than would occur without the addition of the first instance of the boost current $I_{OUT\_P\_BOOST}$.

To facilitate the HI/LO transition, the control module 106 causes (i) the first and third control signals to transition from the high state to the low state, and (ii) the second and fourth control signals to transition from the low state to the high state. This in turn, causes (i) the third switchable current source 302 and the third switch 216 to switch from ON to OFF, and (ii) the first switch 212 and the fourth switchable current source 304 to switch from OFF to ON. The output voltage $V_{OUT\_N}$, in turn, transitions from the LO state to the HI state, and the output voltage $V_{OUT\_P}$ transitions from the HI state to the LO state. Responsively, the differential-output voltage $\Delta V$ begins to undergo the HI/LO transition.

Responsive to the first and second control signals, the second delay circuit 704 provides the first and second intermediate signals to the first and second AND gates 708, 710. The first and second AND gates 708, 710, in turn, provide the first and second booster-control signals $V_{BOOST\_CLK\_P}$, $V_{BOOST\_CLK\_N}$ to the fifth and sixth switches 602, 604, via the fifth and sixth output lines 724, 726. The second booster-control signal $V_{BOOST\_CLK\_N}$ cause the sixth switches 604 to switch ON, which in turn, sources the second instance of the boost current $I_{OUT\_N\_BOOST}$ or otherwise cause the increase in the output load current at the second output terminal 116 by applying the second instance of the boost current $I_{OUT\_N\_BOOST}$. As above, sourcing the second instance of the boost current $I_{OUT\_N\_BOOST}$ causes the output voltage $V_{OUT\_P}$ to transition from the LO state to the HI state more rapidly than would occur without the addition of the first instance of the boost current $I_{OUT\_N\_BOOST}$. Such transition, in turn, causes the differential-output voltage $\Delta V$ to undergo the HI/LO transition more rapidly than would occur without the addition of the second instance of the boost current $I_{OUT\_N\_BOOST}$.

Figure 9:
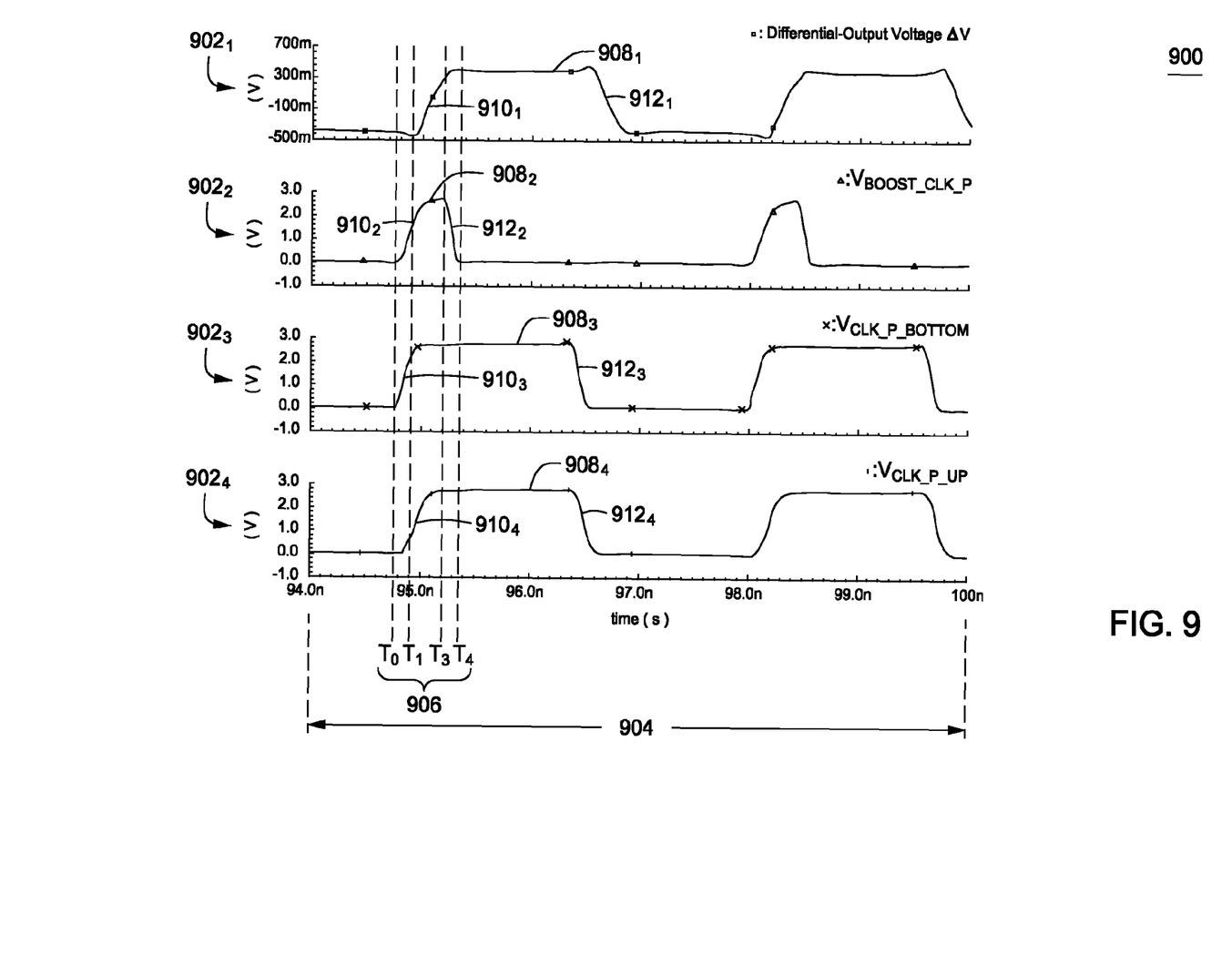
FIG. 9 is a graphical diagram illustrating another example collection of waveforms corresponding to signals associated with a high-speed LVDS system.

FIG. 9 is a graphical diagram illustrating another example collection of waveforms 900 corresponding to signals associated with a high-speed LVDS system. For convenience, the example collection of waveforms 900 is described with reference to an operation of system 800 of FIG. 8.

As shown, the collection of waveforms 900 includes thirteen waveforms, namely waveforms $902_{1-4}$. These waveforms $902_{1-4}$ respectively correspond to signals formed, over a given time period 904, from the differential-output voltage $\Delta V$, first control signal (labeled "$V_{CLK\_P\_UP}$"), third control signal (labeled "$V_{CLK\_P\_BOTTOM}$") and the first booster-control signal $V_{BOOST\_CLK\_P}$. The waveforms $902_{1-4}$ are plotted with respect to time and appropriate measurement units (e.g., volts).

The waveforms $902_{1-4}$ include third transient responses 906 corresponding to the LO/HI transition. The first transient responses 906 are circumscribed by times $T_0$-$T_4$. In addition, the waveforms $902_{1-4}$ include respective steps $908_{1-4}$ having respective leading and trailing edges $910_{1-4}$, $912_{1-4}$.

Prior to the time $T_0$, each of the differential-output voltage $\Delta V$, the first control signal $V_{CLK\_P\_UP}$ and the first booster-control signal $V_{BOOST\_CLK\_P}$ is in the low state. Correspondingly, the first switch 212 is ON and the fifth switch 602 is OFF.

At the time $T_0$, the third control signal $V_{CLK\_P\_BOTTOM}$ starts the transition from the low to the high state, as indicated by the leading edge $910_3$ at the time $T_0$. Responsive to this transition, the eleventh switch 818 switches from OFF to ON. At the same or about the same time $T_0$, the first booster-control $V_{BOOST\_CLK\_P}$ starts the transition from the low state to the high state, as indicated by the leading edge $910_2$ at the time $T_0$. Responsively, the fifth switch 602 switches from OFF to ON. In turn, the first instance of the boost current $I_{OUT\_N\_BOOST}$ increases the output load current at the first output terminal 114.

Between the times $T_0$-$T_1$, the first control signal $V_{CLK\_P\_BOTTOM}$ and the first booster-control signal $V_{BOOST\_CLK\_P}$ continue the transitions from the low states to the high states, as indicated by the leading edges $910_4$, $910_2$ between the times $T_0$-$T_1$. During the same times $T_0$-$T_1$, the differential-output voltage $\Delta V$ remains LO.

At the time $T_1$, the first control signal $V_{CLOCK\_P\_UP}$ starts the transition from the low state to the high state, as indicated by the leading edge $910_4$ at the time $T_1$. Responsively, the first switch 212 switches from ON to OFF. In turn, the differential-output voltage $\Delta V$ starts to undergo the LO/HI transition, as indicated by the leading edge $910_1$ at the time $T_1$.

Between the times $T_1$-$T_2$, the first control signal $V_{CLK\_P\_BOTTOM}$ and the first booster-control signal $V_{BOOST\_CLK\_P}$ complete the transitions from the low states to the high states, as indicated by the leading edges $910_4$, $910_2$ between the times $T_1$-$T_2$. Responsively, the first switch 212 switches from ON to OFF, and the eleventh switch 818 switches from OFF to ON.

At the time $T_2$, the first booster-control signal $V_{BOOST\_CLK\_P}$ starts the transition from the high state to the low state, as indicated by the trailing edge $912_2$ at the time $T_2$. Responsively, the differential-output voltage $\Delta V$ continues to undergo the LO/HI transition.

At a time $T_3$, each of the first and third control signals $V_{CLK\_P\_UP}$, $V_{CLK\_P\_BOTTOM}$ is in the high state, and the first booster-control signal $V_{BOOST\_CLK\_P}$ completes the transition from the high state to the low state. Responsive to this transition, the fifth switch 602 switches from ON to OFF. In turn, the first instance of the boost current $I_{OUT\_P\_BOOST}$ ceases to increase the output load current at the first output terminal 114, and the differential-output voltage $\Delta V$ completes the LO/HI transition.

During the times $T_0$-$T_3$, the first instance of the boost current $I_{OUT\_P\_BOOST}$ may affect the output voltage $V_{OUT\_N}$ so as to shorten (in terms of time) its transition from the low state to the high state. This, in turn, may result in the differential-output voltage ΔV undergoing the LO/HI transition more rapidly than would occur without the addition of the first instance of the boost current $I_{OUT\_P\_BOOST}$.

Figure 10:
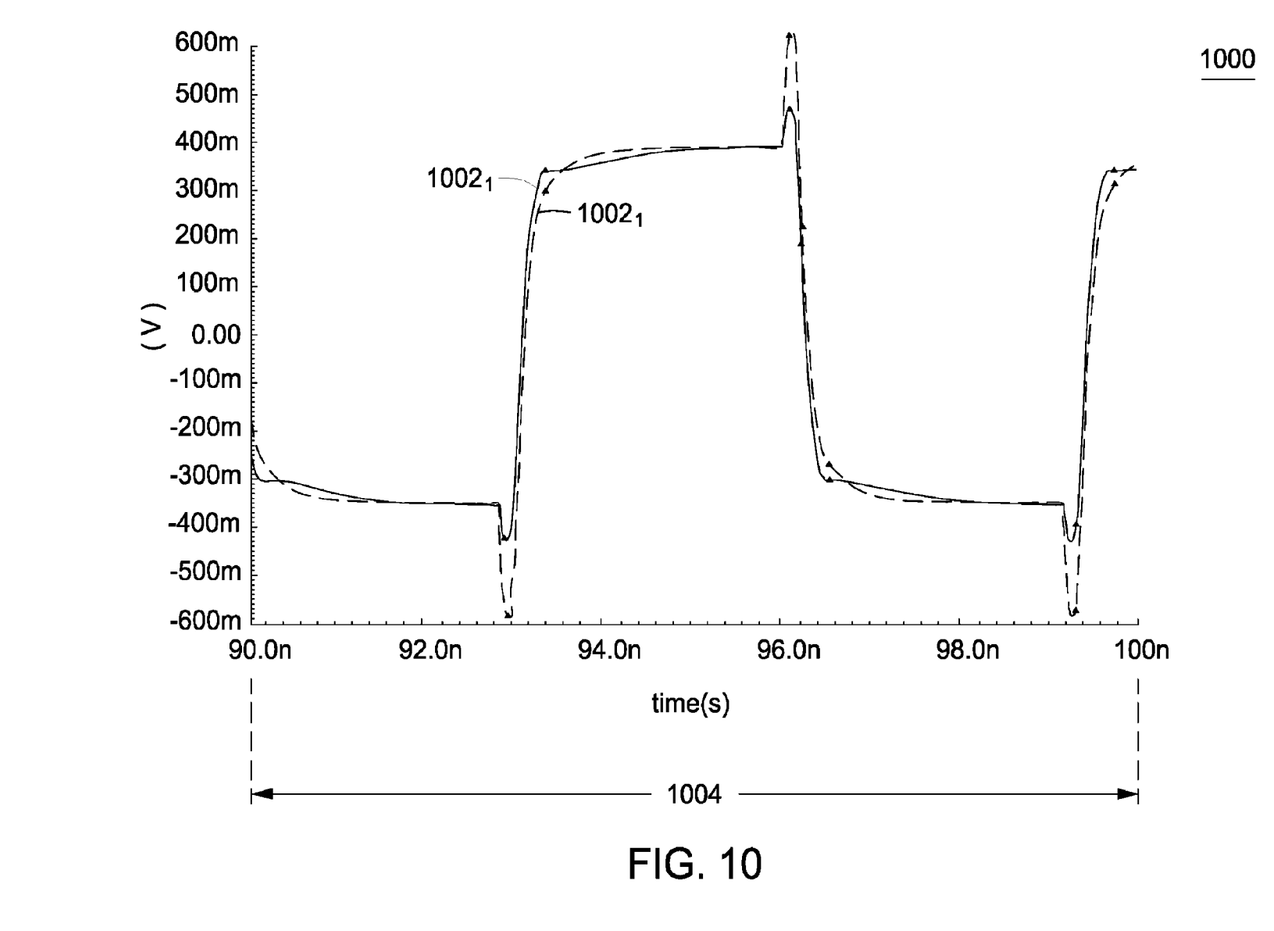
FIG. 10 is a graphical diagram illustrating experimental results of differential-output voltage verses transition times for a high-speed LVDS system.

FIG. 10 is a graphical diagram illustrating another collection of waveforms 1000 corresponding to signals associated with a high-speed LVDS system. As shown, the collection of waveforms 1000 includes two waveforms, namely waveforms $1002_{1-2}$.

The waveform $1002_1$ corresponds to a signal formed, over a given time period 1004, from the differential-output voltage ΔV of the system 200 of FIG. 2. The waveform $1002_2$ corresponds to a signal formed, over the given time period 1004, from the differential-output voltage ΔV of the system 300 of FIG. 3. The waveforms $1002_{1-2}$ are plotted with respect to time and appropriate measurement units (e.g., volts).

Conclusion

Those skilled in the art will appreciate that the present invention, according to its various embodiments, Variations of the method, apparatus and system described above are possible without departing from the scope of the invention. In view of the wide variety of embodiments that can be applied, it should be understood that the illustrated embodiments are exemplary only, and should not be taken as limiting the scope of the following claims. For instance, in the exemplary embodiments described herein include logic or other circuitry, which may include or be utilized with any appropriate voltage source, such as a battery, power supply and the like, providing any appropriate voltage.

In addition, the high-speed LVDS system as set forth in the claims below may beneficially provide high speed, low power data transmission in an economical fashion. Such high-speed LVDS system may also provide significant power savings and superior noise control as compared to one or more known legacy LVDS systems. Consequently, the high-speed LVDS system may provide a cost advantage over the known legacy LVDS systems for any of point-to-point applications for telecommunications, data communications, video displays and various other communications.

It will be apparent to one of ordinary skill in the art that aspects of the invention, as described above, may be implemented in many different forms of software, firmware, and hardware in the implementations illustrated in the figures. Any actual software code or specialized control hardware used to implement aspects consistent with the present invention is not limiting of the present invention. Thus, the operation and behavior of the aspects were described without reference to the specific software code or hardware logic. It should be understood that a person of ordinary skill in the art would be able to design software and control hardware to implement the aspects of the present invention based on the description herein.

The foregoing description of preferred embodiments of the present invention provides illustration and description, but is not intended to be exhaustive or to limit the invention to the precise form disclosed. Modifications and variations are possible in light of the above teachings or may be acquired from practice of the invention.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items.

Exemplary embodiments have been illustrated and described. Further, the claims should not be read as limited to the described order or elements unless stated to that effect. In addition, use of the term "means" in any claim is intended to invoke 35 U.S.C. §112, ¶6, and any claim without the word "means" is not so intended.

What is claimed is:

1. A driver for communicating data at a rate exceeding about several hundred mega bit per second, the driver comprising:
   circuitry comprising an output couplable to a load, and a first, second, third and fourth current source, wherein the circuitry outputs from the output a low voltage differential signal having a first current sourced from the first and second current source for driving the load from a first voltage at a first time to a second voltage at a second time; and
   a current-sourcing module for applying a second current to the output at a third time, wherein the third time occurs about the first time, wherein the second current combines with the first current to reduce a duration between the first time and the second time as compared to the first current alone, and wherein the current-sourcing module is communicatively coupled to drain terminals of the first and second current sources and coupled to drain terminals of the third and fourth current sources, and coupled to a reference voltage.

2. The driver of claim 1, wherein the current-sourcing module comprises a current source.

3. The driver of claim 2, wherein the current source comprises a switch, wherein the switch couples the output to a reference voltage.

4. The driver of claim 2, wherein the current source is a switchable current source.

5. The driver of claim 1, wherein the current-sourcing module comprises (i) a first current source for applying the second current to the output when the first voltage exceeds the second voltage, and (ii) a second current source for applying the second current to the output when the second voltage exceeds the first voltage.

6. The driver of claim 5, wherein the first and second current sources comprise first and second switches, respectively, wherein the first switch couples the output to a first reference voltage when the first voltage exceeds the second voltage, and wherein the second switch couples the output to a second reference voltage when the second voltage exceeds the first voltage.

7. The driver of claim 6, wherein the first and second reference voltages are the same voltage.

8. The driver of claim 7, wherein each of the first and second reference voltages is a ground.

9. The driver of claim 5, wherein the first and second current sources comprise switchable current sources.

10. The driver of claim 1, further comprising a control module for causing (i) the circuitry to generate the low voltage differential signal, and (ii) the current-sourcing module to apply the second current to the output at the third time.

11. The driver of claim 1, further comprising a common mode feedback circuit.

12. The driver of claim 1, wherein the first, second, third, and fourth current sources are MOSFET switches arranged in a bridge configuration such that switching the first, the second, the third, and the fourth MOSFET switches on and off produces the differential output voltage.

13. The driver of claim 1, wherein the first and second current sources are MOSFET switches and the circuitry further comprises a first and a second switchable current source arranged in a bridge configuration such that switching the first and the second MOSFET switches and the first and second switchable current sources on and off produces the differential output voltage.

14. The driver of claim 1, wherein the second current is terminated at a fourth time, and further wherein the fourth time occurs about the second time.

15. The driver of claim 1, whereby the differential-output voltage transitions from the first state to the second state during a period between 0.2 and 0.3 ns.

16. A method for communicating data at a rate exceeding about a gigabit per second, comprising:
outputting, from an output of circuitry couplable to a load, a low voltage differential signal having a first current for driving the load from a first voltage at a first time to a second voltage at a second time, wherein the circuitry comprises a first, second, third and fourth current source and the first current is sourced from the first and second current source; and
applying a second current, from a current sourcing module, to the output at a third time, wherein the third time occurs about the first time, and wherein the second current combines with the first current to reduce a duration between the first time and the second time as compared to the first current alone, wherein the current sourcing module is coupled to drain terminals of the first and second current sources and coupled to drain terminals of the third and fourth current sources, and coupled to a reference voltage.

17. The method of claim 16, wherein applying a second current comprises:
using a first current source to apply the second current to the output when the first voltage exceeds the second voltage; and
using a second current source to apply the second current to the output when the second voltage exceeds the first voltage.

18. The method of claim 17, wherein using a first current source comprises coupling, by a first switch, the output to a first reference voltage, wherein the using a second current source comprises coupling, by a second switch, the output to a second reference voltage, and wherein the first current source comprises the first switch and the second current source comprises the second switch.

19. The method of claim 16, further comprising using a control module to cause (i) generation of the low voltage differential signal and (ii) application of the second current to the output.

20. The method of claim 16, further comprising terminating the second current at a fourth time, wherein the fourth time occurs about the second time.

21. A driver for communicating data at a rate exceeding about a gigabit per second, the driver comprising:
circuitry comprising a first, second, third, and fourth switches arranged in a bridge configuration and an output couplable to a load, wherein the first and the second switches cause the output to provide a first low voltage differential signal having a first current for driving the load from a first voltage at a first time to a second voltage at a second time, and wherein the third and the fourth switches cause the output to provide a second low voltage differential signal having a second current for driving the load from a third voltage at a third time to a fourth voltage at a fourth time; and
a current-sourcing module for applying a third current to the output at about the first time and for applying a fourth current to the output at about the second time, wherein the third current combines with the first current to reduce a duration between the first time and the second time as compared to the first current alone, and wherein the fourth current combines with the second current to reduce a duration between the third time and the fourth time as compared to the third current alone, and wherein the current-sourcing module is communicatively coupled to drain terminals of the first and second switches and coupled to drain terminals of the third and fourth switches, and a coupled to reference voltage.

22. The driver of claim 21, wherein the current-sourcing module comprises a current source.

23. The driver of claim 22, wherein the current source comprises a switch, wherein the switch couples the output to a reference voltage.

24. The driver of claim 23, wherein the reference voltage is a ground.

25. The driver of claim 22, wherein the current source is a switchable current source.

26. The driver of claim 21, wherein current-sourcing module comprises ("i") a first current source for applying the third current to the output, and ("ii") a second current source for applying the fourth current to the output.

27. The driver of claim 26, wherein the first and second current sources comprise fifth and sixth switches, respectively, wherein the fifth switch couples the output to a first reference voltage, and wherein the sixth switch couples the output to a second reference voltage.

28. The driver of claim 27, wherein the first and second reference voltages are the same voltage.

29. The driver of claim 28, wherein each of the first and second reference voltages is a ground.

30. The driver of claim 27, wherein the first and second current sources comprise switchable current sources.

31. The driver of claim 26, wherein the first and second switches comprise first and second n-channel MOSFET transistors.

32. The driver of claim 21, further comprises a control module for causing (i) the first and second switches to generate the first low voltage differential signal, (ii) the third and fourth switches to generate the second low voltage differential signal, and (iii) the current-sourcing module to apply the third and fourth currents to the output.

33. The driver of claim 32, wherein the control module comprises:
first and fourth outputs for providing respective control signals to cause the first and second switches to generate the first low voltage differential signal;
second and third outputs for providing respective control signals to cause the third and fourth switches to generate the second low voltage differential signal;
a fifth output for providing a fifth control signal to cause the current-sourcing module to apply the third current to the output; and
a sixth output for providing a sixth control signal to cause the current-sourcing module to apply the fourth current to the output.

34. The driver of claim 33, wherein:
the first control signal comprises a first input signal shifted by a first phase;
the second control signal comprises a second input signal shifted by the first phase;
the third control signal comprises the first input signal shifted by a third phase;
the fourth control signal comprises the second input signal shifted by the third phase;
the fifth output signal comprises a logical AND of the first input signal with the first control signal shifted by a second phase; and
the sixth output signal comprises a logical AND of the first input signal with the second control signal shifted by the second phase.

* * * * *